(12) United States Patent
Yang

(10) Patent No.: US 10,058,008 B2
(45) Date of Patent: *Aug. 21, 2018

(54) TEMPERATURE CONTROL SYSTEM HAVING ADJACENTLY-INSTALLED TEMPERATURE EQUALIZER AND HEAT TRANSFER FLUID AND APPLICATION DEVICE THEREOF

(71) Applicant: Tai-Her Yang, Dzan-Hwa (TW)

(72) Inventor: Tai-Her Yang, Dzan-Hwa (TW)

( * ) Notice: Subject to any disclaimer, the term of this patent is extended or adjusted under 35 U.S.C. 154(b) by 658 days.

This patent is subject to a terminal disclaimer.

(21) Appl. No.: 14/525,436

(22) Filed: Oct. 28, 2014

(65) Prior Publication Data

US 2015/0114617 A1    Apr. 30, 2015

Related U.S. Application Data

(63) Continuation-in-part of application No. 14/066,282, filed on Oct. 29, 2013.

(51) Int. Cl.
| | | |
|---|---|---|
| *F28F 7/00* | (2006.01) | |
| *H05K 7/20* | (2006.01) | |
| *F28F 27/02* | (2006.01) | |
| *F28F 3/04* | (2006.01) | |
| *F28F 3/12* | (2006.01) | |
| *F28D 21/00* | (2006.01) | |

(52) U.S. Cl.
CPC ......... *H05K 7/20281* (2013.01); *F28F 3/048* (2013.01); *F28F 3/12* (2013.01); *F28F 27/02* (2013.01); *F28D 2021/0029* (2013.01)

(58) Field of Classification Search
CPC ........ F28F 27/02; F28F 2270/00; F28F 3/048; F28F 3/12; F28F 1/16; F28F 7/02; F28F 21/08; F28D 1/06; H01L 23/473; H05K 7/20254; H05K 7/20281
See application file for complete search history.

(56) References Cited

U.S. PATENT DOCUMENTS

| | | | | | |
|---|---|---|---|---|---|
| 3,236,297 | A | * | 2/1966 | Costes | F22B 1/023 122/406.1 |
| 4,127,161 | A | * | 11/1978 | Clyne | F28D 20/02 126/400 |
| 5,906,236 | A | * | 5/1999 | Adams | F28F 3/12 165/147 |
| 6,367,543 | B1 | * | 4/2002 | Calaman | F28F 3/022 165/134.1 |
| 7,508,665 | B1 | * | 3/2009 | Palmer | H05K 7/2079 361/696 |
| 8,132,616 | B1 | * | 3/2012 | Brower | H05K 7/20272 165/101 |
| 2008/0149303 | A1 | * | 6/2008 | Chang | H02K 41/03 165/80.2 |

(Continued)

*Primary Examiner* — Travis Ruby
(74) *Attorney, Agent, or Firm* — Bacon & Thomas, PLLC

(57) ABSTRACT

The present invention provides a temperature control system having adjacently-installed temperature equalizer and heat transfer fluid and application device thereof, in which one or more adjacently-installed temperature equalizer formed with a heat transferring adjacent surface is provided, a fluid channel thereof is utilized for allowing a heat transfer fluid to pass thereby enabling to perform temperature equalizing heat transfer with the external surface and/or the internal surface of an object (103) disposed to the adjacent surface.

16 Claims, 10 Drawing Sheets

(56) References Cited

U.S. PATENT DOCUMENTS

| | | | |
|---|---|---|---|
| 2010/0321880 A1* | 12/2010 | Yeo .......................... | G02B 6/43 361/679.46 |
| 2011/0056668 A1* | 3/2011 | Taras .................... | F28D 1/0478 165/174 |
| 2011/0240269 A1* | 10/2011 | Mackenzie ............... | E03C 1/00 165/141 |
| 2012/0312510 A1* | 12/2012 | Eckberg .................. | F28D 15/00 165/104.33 |

* cited by examiner

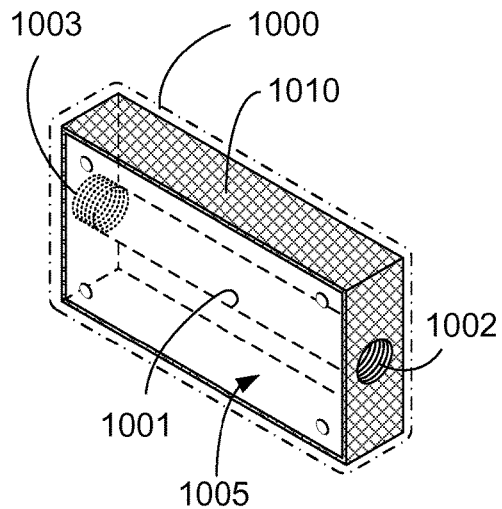
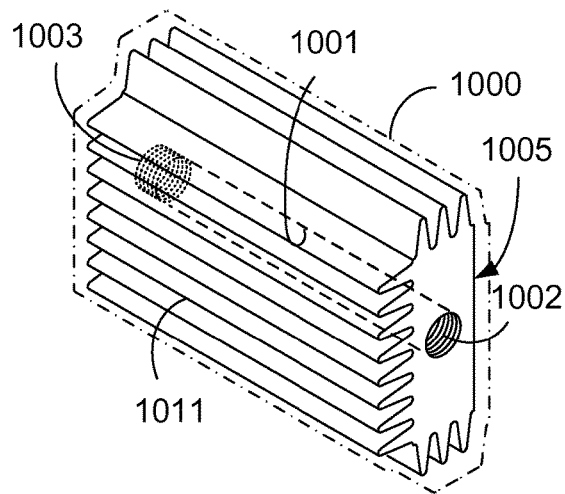
FIG. 3
FIG. 4
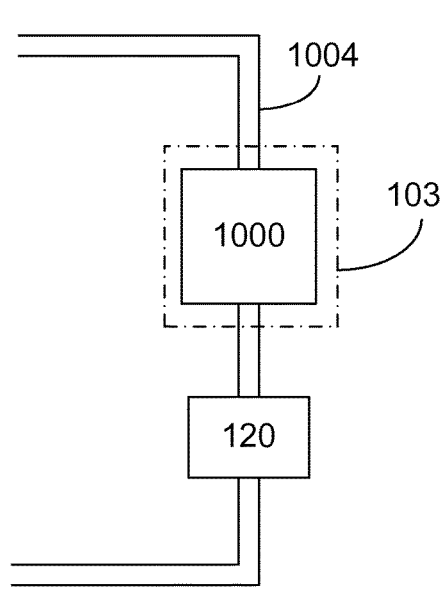
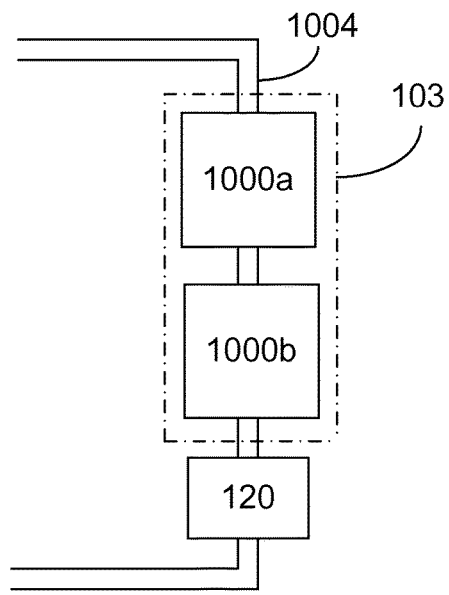
FIG. 5
FIG. 6

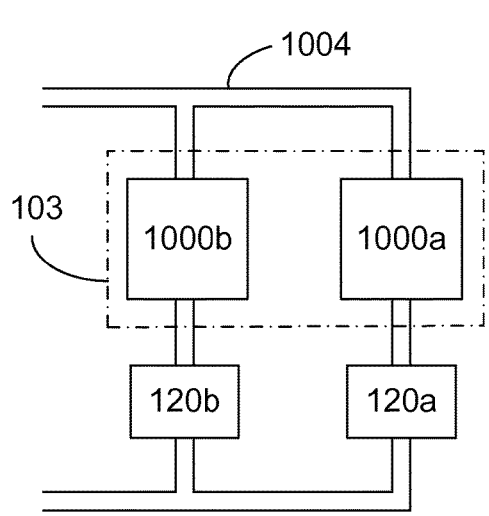
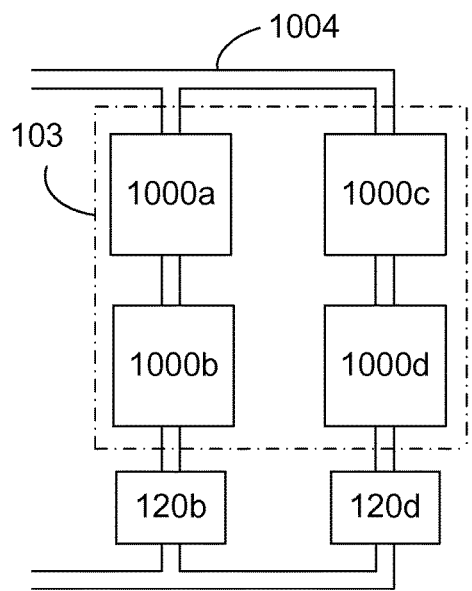
FIG. 7      FIG. 8
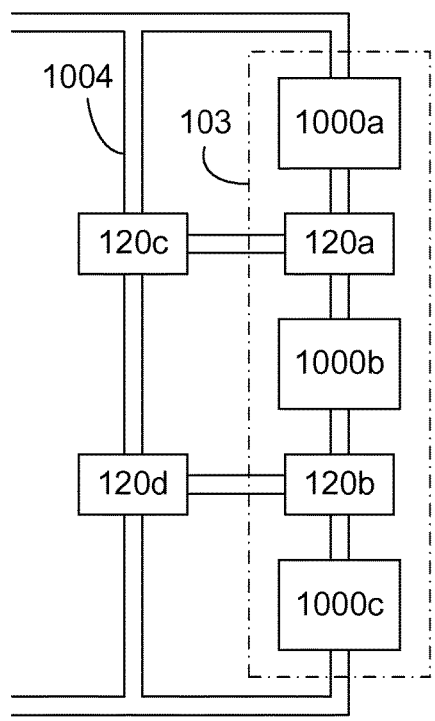
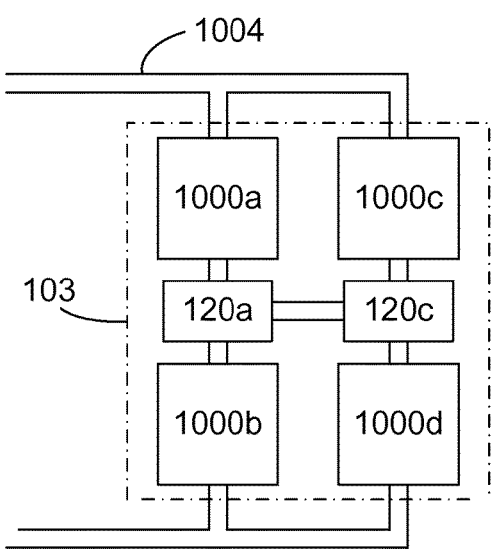
FIG. 9      FIG. 10

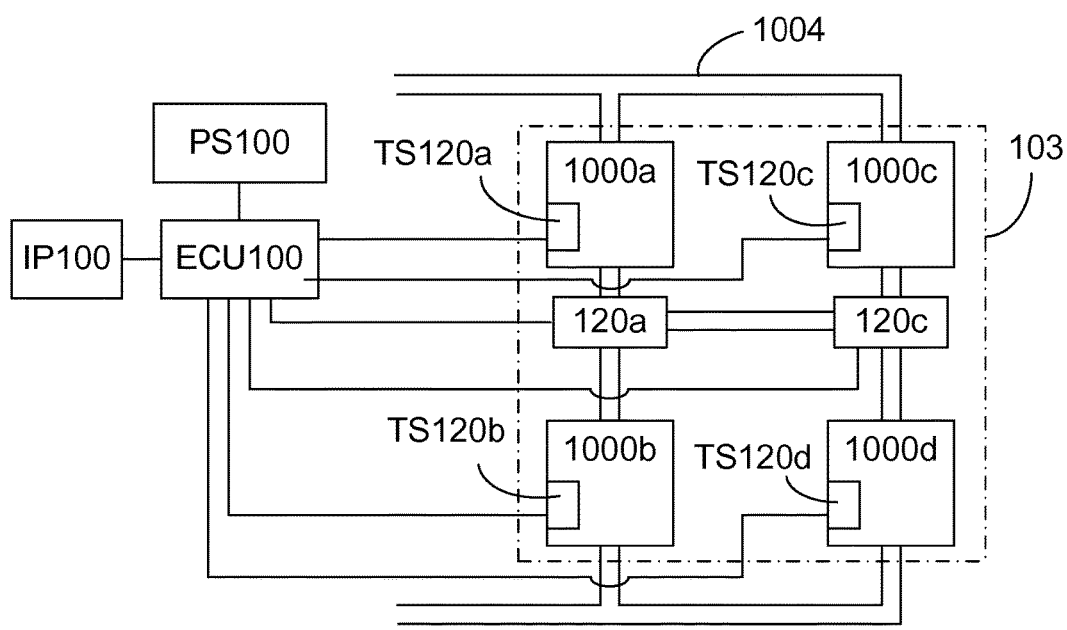
FIG. 16
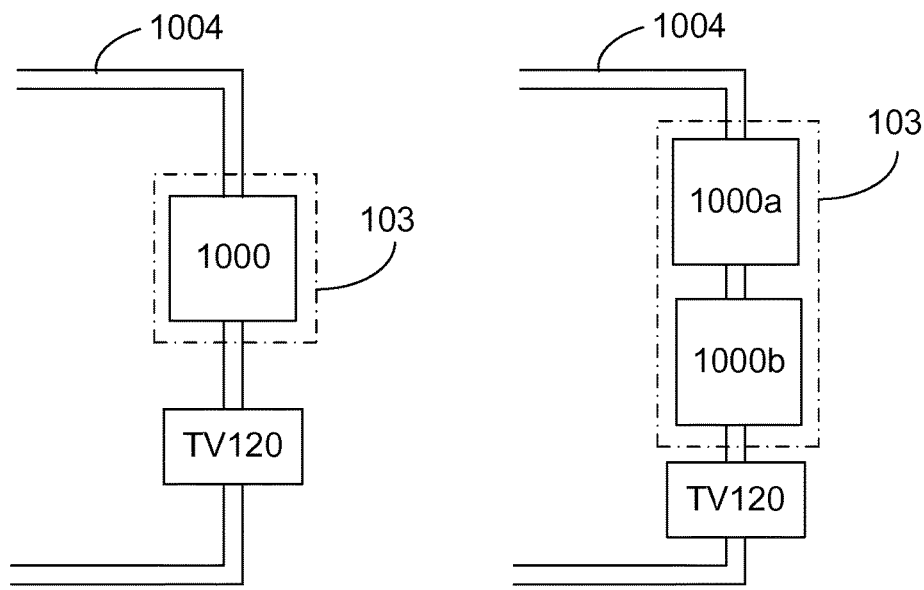
FIG. 17
FIG. 18

US 10,058,008 B2

TEMPERATURE CONTROL SYSTEM HAVING ADJACENTLY-INSTALLED TEMPERATURE EQUALIZER AND HEAT TRANSFER FLUID AND APPLICATION DEVICE THEREOF

CROSS REFERENCE TO RELATED APPLICATION

This is a Continuation-In-Part of application Ser. No. 14/066,282, filed on Oct. 29, 2013.

BACKGROUND OF THE INVENTION (a) Field of the Invention

The present invention provides a temperature control system having adjacently-installed temperature equalizer and heat transfer fluid and application device thereof, in which one or more adjacently-installed temperature equalizer formed with a heat transferring adjacent surface is provided, a fluid channel thereof is utilized for allowing a heat transfer fluid to pass thereby enabling to perform temperature equalizing heat transfer with the external surface and/or the internal surface of an object (103) disposed to the adjacent surface.

(b) Description of the Prior Art

A conventional electric motor, a power generator or a transformer would generate iron loss or copper loss due to the loading getting greater, so the temperature thereof is raised and the efficiency is lowered or the machine itself may be damaged; due to the environmental temperature changes or the thermal loss caused by the machine being operated, a precision machine or a multi dimension measurement device would generate heat thereby being deformed because of thermal expansion and cold shrinkage, under the situation of inhomogeneous material or dissymmetrical geometric shape, when the temperature distribution and the setting status is altered in a greater magnitude, the deformation would become more server and the precision is greatly affected; when the working temperature of a conventional semiconductor unit, a photovoltaic, a LED or a rechargeable battery or a liquid crystal display is overly high or overly low, the performance would be deteriorated, if a solution of the ambient environment being treated with constant temperature control for improving the performance to be adopted, the required equipment is very costly and consumes large amount of electric energy.

SUMMARY OF THE INVENTION

The present invention provides a temperature control system having adjacently-installed temperature equalizer and heat transfer fluid and application device thereof, in which one or more adjacently-installed temperature equalizer formed with a heat transferring adjacent surface is provided, a fluid channel thereof is utilized for allowing a heat transfer fluid to pass thereby enabling to perform temperature equalizing heat transfer with the external surface and/or the internal surface of an object (103) disposed to the adjacent surface; the temperature controlling object (103) includes a rechargeable battery or a liquid crystal display, a semiconductor substrate, a heat dissipater, an air conditioning heat exchanger, or a machine housing of a precision machine or a multi dimension measurement device, or a selected location at the exterior and/or the interior of the machine housing, through pumping the external heat transfer fluid for cooling or heating, the adjacently-installed object (103) is enabled to be processed with the heat transfer for being cooled or heated, thereby preventing the working temperature of the semiconductor unit, the photovoltaic, the LED or the rechargeable battery or the liquid crystal display from being overly high or overly low and avoiding the performance deterioration; and/or when being applied in an electric motor, a power generator or a transformer with its loading getting greater or the environmental temperature getting higher, the overheating and performance deterioration and the burning damage can be prevented, when being applied in the precision machine or the multi dimension measurement device, the geometric shape of the machine housing can be ensured to be stable and the precision can also be ensured.

BRIEF DESCRIPTION OF THE DRAWINGS

FIG. 3 is a perspective view illustrating the adjacently-installed temperature equalizer with its opened surface being provided with heat insulating property according to the present invention.

FIG. 4 is a perspective view illustrating the adjacently-installed temperature equalizer with its opened surface being provided with heat transferring property according to the present invention.

FIG. 5 is a schematic view illustrating a temperature control system being structured by a single adjacently-installed temperature equalizer (1000) being connected in series with a fluid valve (120) through a pipeline (1004) according to the present invention.

FIG. 6 is a schematic view illustrating a temperature control system being structured by plural adjacently-installed temperature equalizers (1000a), (1000b) being connected in series through a pipeline (1004) then connected in series with a fluid valve (120) according to the present invention.

FIG. 7 is a schematic view illustrating a temperature control system being structured by plural adjacently-installed temperature equalizers (1000a), (1000b) being respectively connected in series with a fluid valve through a pipeline (1004) then being connected in parallel according to the present invention.

FIG. 8 is a schematic view illustrating a temperature control system being structured by adjacently-installed temperature equalizers (1000a), (1000b) being connected in series with a fluid valve (120b) through a pipeline (1004) and adjacently-installed temperature equalizers (1000c), (1000d) being connected in series with a fluid valve (120a) through the pipeline (1004) then connected in parallel according to the present invention.

FIG. 9 is a schematic view illustrating a temperature control system being structured by plural adjacently-installed temperature equalizers (1000a), (1000b), (1000c) and fluid valves (120a), (120b) being connected in series through a pipeline (1004), and fluid valves (120c), (120d) being served to provide the bypass control according to the present invention.

FIG. 10 is a schematic view illustrating a temperature control system being structured by plural adjacently-installed temperature equalizers (1000*a*), (1000*b*), (1000*c*), (1000*d*) connected in series and in parallel through a pipeline (1004), a fluid valve (120*a*) being connected in series between the adjacently-installed temperature equalizer (1000*a*) and the adjacently-installed temperature equalizer (1000*b*), a fluid valve (120*c*) being connected in series between the adjacently-installed temperature equalizer (1000*c*) and the adjacently-installed temperature equalizer (1000*d*), a communicating pipeline is installed between the fluid valve (120*a*) and the fluid valve (120*c*) for providing the bypass control according to the present invention.

FIG. 16 is a schematic view illustrating a temperature control system being structured by plural adjacently-installed temperature equalizers (1000*a*), (1000*b*), (1000*c*), (1000*d*) being respectively installed with a temperature sensor (TS120*a*), (TS120*b*), (TS120*c*), (TS120*d*), the adjacently-installed temperature equalizer (1000*a*), a fluid valve (120*a*) and the adjacently-installed temperature equalizer (1000*b*) being in sequence connected in series through a pipeline (1004), the adjacently-installed temperature equalizer (1000*c*), a fluid valve (120*c*) and the adjacently-installed temperature equalizer (1000*d*) being in sequence connected in series through the pipeline (1004), then being connected in parallel, a communicating pipeline being installed between the fluid valve (120*a*) and the fluid valve (120*c*), the fluid valves (120*a*), (120*b*) being served to provide the bypass control and controlled by an electric control unit (ECU100) according to the present invention.

FIG. 17 is a schematic view illustrating a temperature control system being structured by single adjacently-installed temperature equalizer (1000) being connected in series with a temperature actuated fluid valve (TV120) through a pipeline (1004) and controlled by the temperature actuated fluid valve (TV120) according to the present invention.

FIG. 18 is a schematic view illustrating a temperature control system being structured by plural adjacently-installed temperature equalizers (1000*a*), (1000*b*) being connected in series through a pipeline (1004) then being connected in series with a temperature actuated fluid valve (TV120) and controlled by the temperature actuated fluid valve (TV120) according to the present invention.

DESCRIPTION OF MAIN COMPONENT SYMBOLS

Figure 1:
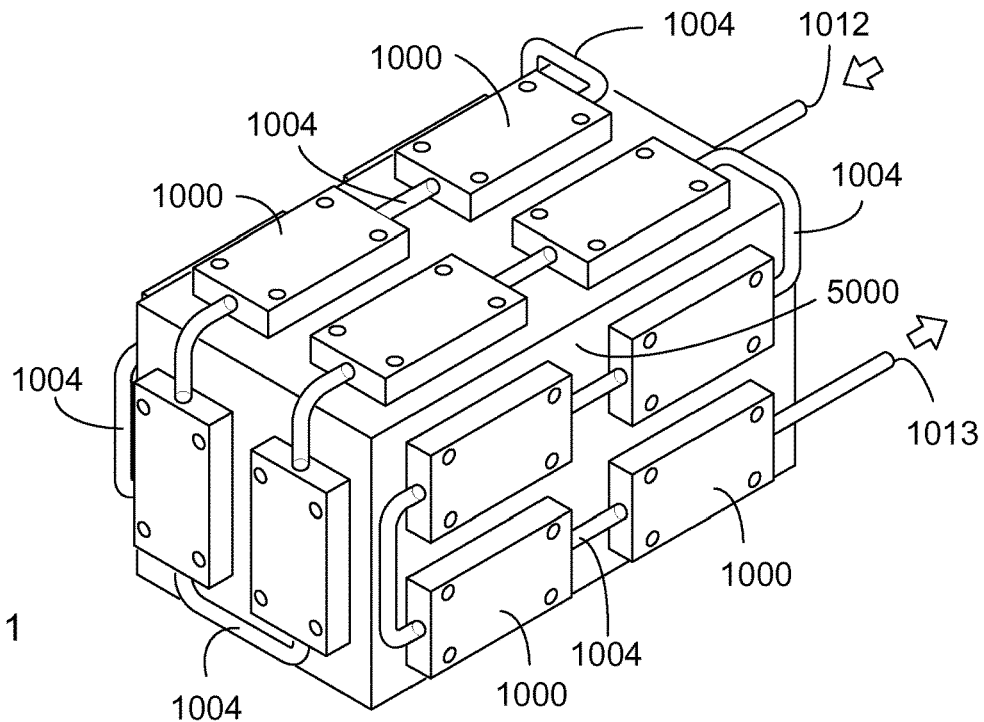
FIG. 1 is a schematic view illustrating the adjacently-installed temperature equalizer being adjacently installed on an external surface of an object (103) according to the present invention.

103: Object
120、120a、120b、120c、120d: Fluid valve
1000、1000a、1000b、1000c、1000d: Adjacently-installed temperature equalizer
1001: Fluid channel
1002、1003: Fluid inlet/outlet port
1004: Pipeline
1005: Thermal energy transferring surface
1010: Heat insulation layer
1011: Heat dissipating sheet
1012、1013: Fluid pipe opening
2000: Revolving electric machine
3000: Tool machine body
4000: Transformer
5000: External surface of the object
5001: Internal surface of the object
TS120、TS120a、TS120b、TS120c、TS120d: Temperature sensor
TV120、TV120a、TV120b、TV120c、TV120d: Temperature actuated fluid valve
ECU100: Electric control unit
IP100: Input control device
PS100: Power supply device

DETAILED DESCRIPTION OF THE PREFERRED EMBODIMENTS

A conventional electric motor, a power generator or a transformer would generate iron loss or copper loss due to the loading getting greater, so the temperature thereof is raised and the efficiency is lowered or the machine itself may be damaged; due to the environmental temperature changes or the thermal loss caused by the machine being operated, a precision machine or a multi dimension measurement device would generate heat thereby being deformed because of thermal expansion and cold shrinkage, under the situation of inhomogeneous material or dissymmetrical geometric shape, when the temperature distribution and the setting status is altered in a greater magnitude, the deformation would become more server and the precision is greatly affected; when the working temperature of a conventional semiconductor unit, a photovoltaic, a LED or a rechargeable battery or a liquid crystal display is overly high or overly low, the performance would be deteriorated, if a solution of the ambient environment being treated with constant temperature control for improving the performance to be adopted, the required equipment is very costly and consumes large amount of electric energy;

The present invention provides a temperature control system having adjacently-installed temperature equalizer and heat transfer fluid and application device thereof, in which one or more adjacently-installed temperature equalizer (1000) formed with a heat transferring adjacent surface is provided, a fluid channel (1001) thereof is utilized for allowing a heat transfer fluid to pass thereby enabling to perform temperature equalizing heat transfer with the external surface (5000) and/or the internal surface (5001) of an object disposed to the adjacent surface; the temperature controlling object (103) includes a rechargeable battery or a liquid crystal display, a semiconductor substrate, a heat dissipater, an air conditioning heat exchanger, or a machine housing of a precision machine or a multi dimension measurement device, or a selected location at the exterior and/or the interior of the machine housing; through the pumping the external heat transfer fluid for cooling or heating and allowing the fluid to pass a fluid pipe opening (1012), the fluid channel (1001) and a fluid pipe opening (1013) at another end, the adjacently-installed object (103) is enabled to be processed with the heat transfer for being cooled or heated, thereby preventing the working temperature of the semiconductor unit, the photovoltaic, the LED or the rechargeable battery or the liquid crystal display from being overly high or overly low and avoiding the performance deterioration; and/or when being applied in an electric motor, a power generator or a transformer with its loading getting greater or the environmental temperature getting higher, the overheating and performance deterioration and the burning damage can be prevented, when being applied in the precision machine or the multi dimension measurement device, the geometric shape of the machine housing can be ensured to be stable and the precision can also be ensured.

FIG. 1 is a schematic view illustrating the adjacently-installed temperature equalizer being adjacently installed on an external surface of an object (103) according to the present invention.

Figure 2:
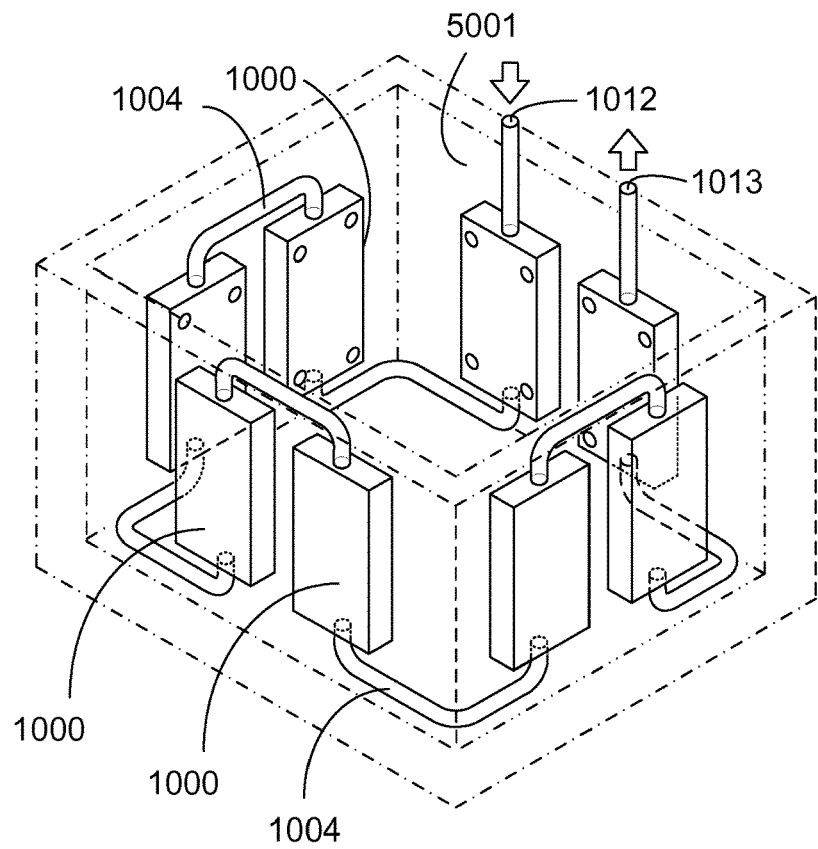
FIG. 2 is a schematic view illustrating the adjacently-installed temperature equalizer being adjacently installed on an internal surface of the object (103) according to the present invention.

FIG. 2 is a schematic view illustrating the adjacently-installed temperature equalizer being adjacently installed on an internal surface of the object (103) according to the present invention.

According to the temperature control system having adjacently-installed temperature equalizer and heat transfer fluid and application device thereof, the adjacently-installed temperature equalizer adjacently installed on the object (103) is made of a heat conductive material, and composed of an adjacently-installed temperature equalizer with its opened surface being provided with heat insulating property or an adjacently-installed temperature equalizer with its opened surface being provided with heat transferring property, and fastened on a heat transferring structural surface of the object (103) by a means of adhering, pressing, soldering, riveting or screwing;

FIG. 3 is a perspective view illustrating the adjacently-installed temperature equalizer with its opened surface being provided with heat insulating property according to the present invention.

As shown in FIG. 3, the adjacently-installed temperature equalizer (1000) is made of a material having better heat transferring property, such as gold, silver, copper, aluminum, magnesium aluminum alloy, iron or ceramic, and formed with a fluid channel (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the adjacently-installed temperature equalizer (1000) is formed with a thermal energy transferring surface (1005), and beside the thermal energy transferring surface (1005), other opened surfaces are respectively formed with a heat insulation layer (1010) for preventing or reducing the heat transfer of radiating, transferring and convecting to the exterior;

The means for adjacently installing the adjacently-installed temperature equalizer (1000) with single fluid channel (1001) on the object (103) includes being fastened on the heat transferring structural surface of the object (103) by a means of adhering, pressing, soldering, riveting or screwing.

FIG. 4 is a perspective view illustrating the adjacently-installed temperature equalizer with its opened surface being provided with heat transferring property according to the present invention.

As shown in FIG. 4, the adjacently-installed temperature equalizer (1000) is made of a material having better heat transferring property, such as gold, silver, copper, aluminum, magnesium aluminum alloy, iron or ceramic, and formed with a fluid channel (1001), and a fluid inlet/outlet port (1002) and a fluid inlet/outlet port (1003) at two ends of the fluid channel (1001) for being connected with a pipeline for allowing the gaseous, or liquid, or gaseous converting into liquid or liquid converting into gaseous fluid to be inputted or outputted; the fluid channel (1001) is formed with a thermal energy transferring surface (1005), and beside the thermal energy transferring surface (1005), other opened surfaces are respectively formed with the structure, such as a heat dissipating sheet (1011) in the wing sheet structure, for facilitating thermal energy to be transferred, convected or radiated to the exterior thereby transferring heat to the exterior;

The means for adjacently installing the adjacently-installed temperature equalizer (1000) with single fluid channel (1001) on the object (103) includes being fastened on the heat transferring structural surface of the object (103) by a means of adhering, pressing, soldering, riveting or screwing.

According to the temperature control system having adjacently-installed temperature equalizer and heat transfer fluid and application device thereof, the adjacently-installed temperature equalizer (1000) is adjacently installed on the heat transferring surface of the object (103) for transferring thermal energy to the object (103), the fluid passing the fluid channel (1001) of the adjacently-installed temperature equalizer (1000) can be further combined with a fluid amount control device and/or a flowing direction control device and/or a temperature sensor and/or an electric control unit and/or an input control device and/or a power supply device and/or a temperature actuated fluid valve, for controlling ON/OFF, fluid amount, flowing direction of the fluid passing the fluid channel (1001) of the adjacently-installed temperature equalizer (1000);

FIG. 5 to FIG. 10 illustrate the temperature control system having adjacently-installed temperature equalizer and heat transfer fluid and application device thereof being applied for structuring a temperature control system in which one or more than one adjacently-installed temperature equalizer installed on the heat transferring surface of the object (103) being installed with one or more than one fluid valve;

FIG. 5 is a schematic view illustrating a temperature control system being structured by a single adjacently-installed temperature equalizer (1000) being connected in series with a fluid valve (120) through a pipeline (1004) according to the present invention.

As shown in FIG. 5, the temperature control system is structured by series connecting a single adjacently-installed temperature equalizer (1000) with the fluid valve (120) through the pipeline (1004), wherein the fluid valve (120) is directly operated by manual force or indirectly operated by mechanical force or electromagnetic force or air pressure force or hydraulic force controlled by manual force for controlling the fluid valve to be ON/OFF or controlling the fluid amount, so as to regulate the fluid amount passing the adjacently-installed temperature equalizer (1000), thereby regulating the thermal energy transferred to the location where the object (103) is disposed.

FIG. 6 is a schematic view illustrating a temperature control system being structured by plural adjacently-installed temperature equalizers (1000a), (1000b) being connected in series through a pipeline (1004) then connected in series with a fluid valve (120) according to the present invention.

As shown in FIG. 6, the temperature control system is structured by series connecting the adjacently-installed temperature equalizers (1000a), (1000b) through the pipeline (1004) then further series connecting with the fluid valve (120); wherein the fluid valve (120) connected in series is directly operated by manual force or indirectly operated by mechanical force or electromagnetic force or air pressure force or hydraulic force controlled by manual force for controlling the fluid valve to be ON/OFF or controlling the fluid amount, so as to regulate the fluid amount passing the adjacently-installed temperature equalizers (1000a), (1000b) connected in series, thereby regulating the thermal energy transferred to the location where the object (103) is disposed.

FIG. 7 is a schematic view illustrating a temperature control system being structured by plural adjacently-installed temperature equalizers (1000a), (1000b) being respectively connected in series with a fluid valve through a pipeline (1004) then being connected in parallel according to the present invention.

As shown in FIG. 7, the temperature control system is structured by series connecting the adjacently-installed temperature equalizer (1000a) with the fluid valve (120a) through the pipeline (1004) and series connecting the adjacently-installed temperature equalizer (1000b) with the fluid valve (120b) through the pipeline (1004) then the two temperature equalizers respectively in two pipelines being connected in parallel; wherein the individual fluid valve (120a), (120b) is respectively and/or jointly operated by manual force directly or indirectly operated by mechanical force or electromagnetic force or air pressure force or hydraulic force controlled by manual force for controlling the fluid valve to be ON/OFF or controlling the fluid amount, so as to regulate the fluid amount passing the corresponding adjacently-installed temperature equalizers (1000a), (1000b) connected in series, thereby regulating the thermal energy transferred to the location where the object (103) is disposed.

FIG. 8 is a schematic view illustrating a temperature control system being structured by adjacently-installed temperature equalizers (1000a), (1000b) being connected in series with a fluid valve (120b) through a pipeline (1004) and adjacently-installed temperature equalizers (1000c), (1000d) being connected in series with a fluid valve (120a) through the pipeline (1004) then connected in parallel according to the present invention.

As shown in FIG. 8, the temperature control system is structured by series connecting the adjacently-installed temperature equalizers (1000a), (1000b) with the fluid valve (120b) through the pipeline (1004) and series connecting the adjacently-installed temperature equalizers (1000c), (1000d) being connected in series with the fluid valve (120a) through the pipeline (1004) then parallel connecting said temperature equalizers respectively in two pipelines; wherein the individual fluid valve (120b), (120d) is respectively and/or jointly operated by manual force directly or indirectly operated by mechanical force or electromagnetic force or air pressure force or hydraulic force controlled by manual force for controlling the fluid valve to be ON/OFF or controlling the fluid amount, so as to regulate the fluid amount passing the adjacently-installed temperature equalizers (1000a), (1000b), (1000c), (1000d) installed at different locations of the object (103), thereby regulating the thermal energy transferred to the location where the object (103) is disposed.

FIG. 9 is a schematic view illustrating a temperature control system being structured by plural adjacently-installed temperature equalizers (1000a), (1000b), (1000c) and fluid valves (120a), (120b) being connected in series through a pipeline (1004), and fluid valves (120c), (120d) being served to provide the bypass control according to the present invention.

As shown in FIG. 9, the temperature control system is structured by series connecting the adjacently-installed temperature equalizers (1000a), (1000b), (1000c) and the fluid valves (120a), (120b) through the pipeline (1004), and connecting the series-connected fluid valves (120c), (120d) among two inlet/outlet ends of the pipeline (1004) and the fluid valve (120a) and the fluid valve (120b), wherein the fluid valve (120c) and the fluid valve (120d) being served to provide the bypass control; wherein the individual fluid valve (120a), (120b), (120c), (120d) is respectively and/or jointly operated by manual force directly or indirectly operated by mechanical force or electromagnetic force or air pressure force or hydraulic force controlled by manual force for controlling the fluid valve to be ON/OFF or controlling the fluid amount, so as to regulate the fluid amount passing the adjacently-installed temperature equalizers (1000a), (1000b), (1000c) installed at different locations of the object (103), thereby regulating the thermal energy transferred to the location where the object (103) is disposed.

FIG. 10 is a schematic view illustrating a temperature control system being structured by plural adjacently-installed temperature equalizers (1000a), (1000b), (1000c), (1000d) connected in series and in parallel through a pipeline (1004), a fluid valve (120a) being connected in series between the adjacently-installed temperature equalizer (1000a) and the adjacently-installed temperature equalizer (1000b), a fluid valve (120c) being connected in series between the adjacently-installed temperature equalizer (1000c) and the adjacently-installed temperature equalizer (1000d), a communicating pipeline is installed between the fluid valve (120a) and the fluid valve (120c) for providing the bypass control according to the present invention.

As shown in FIG. 10, the temperature control system is structured by series-parallel connecting plural adjacently-installed temperature equalizers (1000a), (1000b), (1000c), (1000d) through the pipeline (1004), series connecting the fluid valve (120a) between the adjacently-installed temperature equalizer (1000a) and the adjacently-installed temperature equalizer (1000b), series connecting the fluid valve (120c) between the adjacently-installed temperature equalizer (1000c) and the adjacently-installed temperature equalizer (1000d), and a communicating pipeline is installed between the fluid valve (120a) and the fluid valve (120c) for providing bypass control; wherein the individual fluid valve (120a), (120c) is respectively and/or jointly operated by manual force directly or indirectly operated by mechanical force or electromagnetic force or air pressure force or hydraulic force controlled by manual force for controlling the fluid valve to be ON/OFF or controlling the fluid amount, so as to regulate the fluid amount passing the adjacently-installed temperature equalizers (1000a), (1000b), (1000c), (1000d) installed at different locations of the object (103), thereby regulating the thermal energy transferred to the location where the object (103) is disposed.

Figure 11:
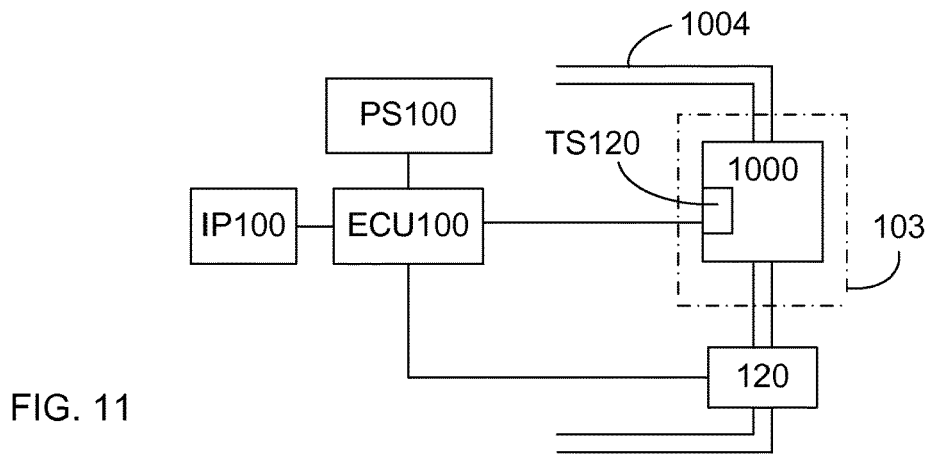
FIG. 11 is a schematic view illustrating a temperature control system being structured by a single adjacently-installed temperature equalizer (1000) installed with a temperature sensor (TS120) being connected in series with a fluid valve (120) through a pipeline (1004) and controlled by an electric control unit (ECU100) according to the present invention.

FIG. 11 to FIG. 16 illustrate the temperature control system having adjacently-installed temperature equalizer and heat transfer fluid and application device thereof being applied for structuring a temperature control system in which one or more than one adjacently-installed temperature equalizer installed on the heat transferring surface of the object (103) being installed with a temperature sensor, an electric control unit and a regulated fluid valve;

FIG. 11 is a schematic view illustrating a temperature control system being structured by a single adjacently-installed temperature equalizer (1000) installed with a temperature sensor (TS120) being connected in series with a fluid valve (120) through a pipeline (1004) and controlled by an electric control unit (ECU100) according to the present invention.

As shown in FIG. 11, the single adjacently-installed temperature equalizer (1000) installed with the temperature sensor (TS120) is connected in series with the fluid valve (120) through the pipeline (1004) and controlled by the electric control unit (ECU100), thereby structuring temperature control system; wherein the electric control unit (ECU100) receives the signal of an input control device (IP100) and the signal sensed by the temperature sensor (TS120) for controlling the fluid valve (120) to be ON/OFF or controlling the passing fluid amount, so as to control the fluid amount passing the adjacently-installed temperature equalizer (1000), thereby altering the thermal energy transferred to the object (103); wherein The electric control unit (ECU100): constituted by one or more than one of followings, including: 1) electromechanical circuit device; 2) solid state electronic circuit device; 3) devices consisted of microprocessor, or single chip control unit, software, operation program and peripheral circuit devices;

Input control device (IP100): constituted by the human-machine interface device and subjected to receive manual input or receive inputted signals or operative commands;

A power supply device (PS100) is served to provide electric energy for the system operation.

Figure 12:
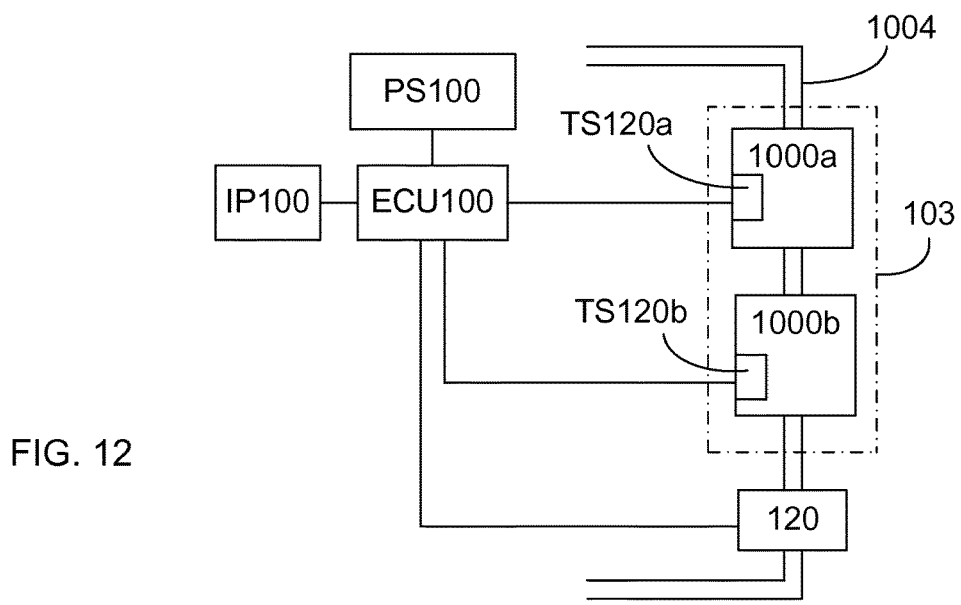
FIG. 12 is a schematic view illustrating a temperature control system being structured by plural adjacently-installed temperature equalizers (1000*a*), (1000*b*) respectively installed with a temperature sensor (TS120*a*), (TS120*b*) being connected in series through a pipeline (1004) then connected in series with a fluid valve (120) and controlled by an electric control unit (ECU100) according to the present invention.

FIG. 12 is a schematic view illustrating a temperature control system being structured by plural adjacently-installed temperature equalizers (1000a), (1000b) respectively installed with a temperature sensor (TS120a), (TS120b) being connected in series through a pipeline (1004) then connected in series with a fluid valve (120) and controlled by an electric control unit (ECU100) according to the present invention.

As shown in FIG. 12, the plural adjacently-installed temperature equalizers (1000a), (1000b) respectively installed with a temperature sensor (TS120a), (TS120b) are connected in series through the pipeline (1004) then connected in series with the fluid valve (120) and controlled by the electric control unit (ECU100), thereby structuring the temperature control system; wherein the electric control unit (ECU100) receives the signal of the input control device (IP100) and the signal sensed by the temperature sensor (TS120a), (TS120b) for controlling the fluid valve (120) to be ON/OFF or controlling the passing fluid amount, so as to control the fluid amount passing the adjacently-installed temperature equalizers (1000a), (1000b), thereby altering the thermal energy transferred to the object (103); wherein The electric control unit (ECU100): constituted by one or more than one of followings, including: 1) electromechanical circuit device; 2) solid state electronic circuit device; 3) devices consisted of microprocessor, or single chip control unit, software, operation program and peripheral circuit devices;

Input control device (IP100): constituted by the human-machine interface device and subjected to receive manual input or receive inputted signals or operative commands;

The power supply device (PS100) is served to provide electric energy for the system operation.

Figure 13:
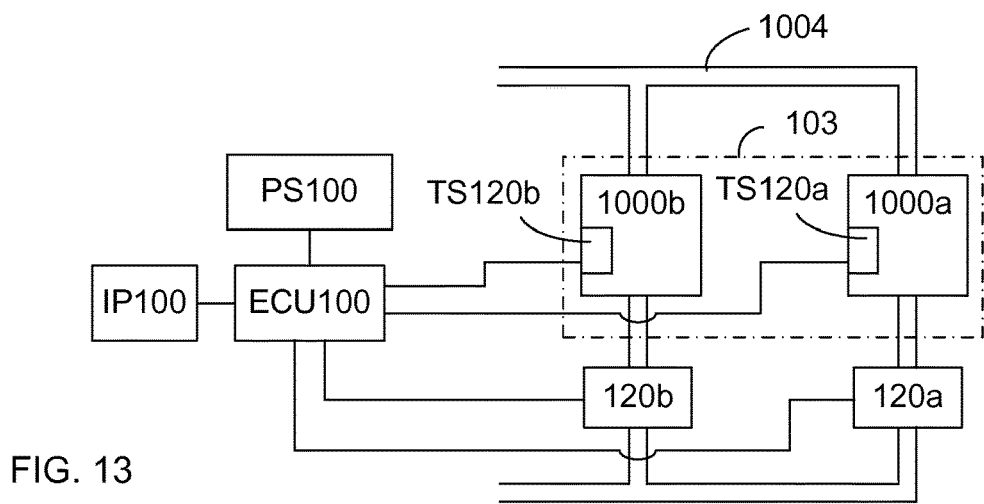
FIG. 13 is a schematic view illustrating a temperature control system being structured by adjacently-installed temperature equalizers (1000*a*), (1000*b*) being respectively installed with a temperature sensor (TS120*a*), (TS120*b*), wherein the adjacently-installed temperature equalizer (1000*a*) being connected in series with a fluid valve (120*a*) through a pipeline (1004), the adjacently-installed temperature equalizer (1000*b*) being connected in series with a fluid valve (120*b*) through the pipeline (1004) then being connected in parallel and controlled by an electric control unit (ECU100) according to the present invention.

FIG. 13 is a schematic view illustrating a temperature control system being structured by adjacently-installed temperature equalizers (1000a), (1000b) being respectively installed with a temperature sensor (TS120a), (TS120b), wherein the adjacently-installed temperature equalizer (1000a) being connected in series with a fluid valve (120a) through a pipeline (1004), the adjacently-installed temperature equalizer (1000b) being connected in series with a fluid valve (120b) through the pipeline (1004) then being connected in parallel and controlled by an electric control unit (ECU100) according to the present invention.

As shown in FIG. 13, the adjacently-installed temperature equalizers (1000a), (1000b) are respectively installed with the temperature sensor (TS120a), (TS120b); wherein the adjacently-installed temperature equalizer (1000a) is connected in series with the fluid valve (120a) through the pipeline (1004), the adjacently-installed temperature equalizer (1000b) is connected in series with the fluid valve (120b) through the pipeline (1004), and then the two temperature equalizers (1000a, 1000b) respectively one two pipelines are connected in parallel and controlled by the electric control unit (ECU100), thereby structuring the temperature control system; wherein the electric control unit (ECU100) receives the signal of the input control device (IP100) and the signal sensed by the temperature sensor (TS120a), (TS120b) for respectively controlling the fluid valve (120a), (120b) to be ON/OFF or controlling the passing fluid amount, so as to respectively control the fluid amount passing the adjacently-installed temperature equalizers (1000a), (1000b), thereby altering the thermal energy transferred by the individual adjacently-installed temperature equalizer to the location where the object (103) is disposed; wherein The electric control unit (ECU100): constituted by one or more than one of followings, including: 1) electromechanical circuit device; 2) solid state electronic circuit device; 3) devices consisted of microprocessor, or single chip control unit, software, operation program and peripheral circuit devices;

Input control device (IP100): constituted by the human-machine interface device and subjected to receive manual input or receive inputted signals or operative commands;

The power supply device (PS100) is served to provide electric energy for the system operation.

Figure 14:
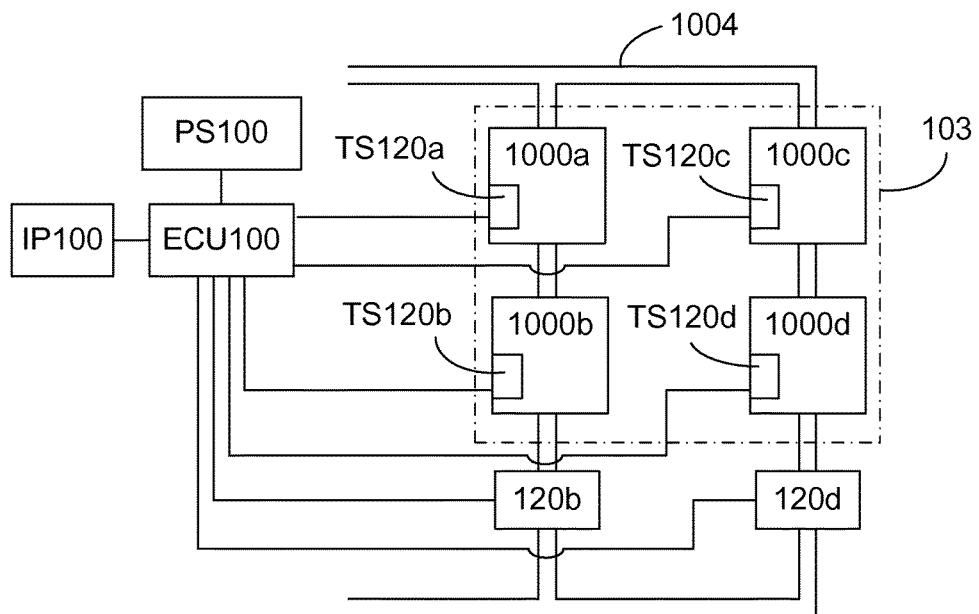
FIG. 14 is a schematic view illustrating a temperature control system being structured by adjacently-installed temperature equalizers (1000*a*), (1000*b*), (1000*c*), (1000*d*) being respectively installed with a temperature sensor (TS120*a*), (TS120*b*), (TS120*c*), (TS120*d*), wherein the adjacently-installed temperature equalizer (1000*a*) and the adjacently-installed temperature equalizer (1000*b*) and a fluid valve (120*b*) being in sequence connected in series through a pipeline (1004), the adjacently-installed temperature equalizer (1000*c*) and the adjacently-installed temperature equalizer (1000*d*) and a fluid valve (120*d*) being in sequence connected in series through the pipeline (1004) then being connected in parallel and controlled by an electric control unit (ECU100) according to the present invention.

FIG. 14 is a schematic view illustrating a temperature control system being structured by adjacently-installed temperature equalizers (1000a), (1000b), (1000c), (1000d) being respectively installed with a temperature sensor (TS120a), (TS120b), (TS120c), (TS120d), wherein the adjacently-installed temperature equalizer (1000a) and the adjacently-installed temperature equalizer (1000b) and a fluid valve (120b) being in sequence connected in series through a pipeline (1004), the adjacently-installed temperature equalizer (1000c) and the adjacently-installed temperature equalizer (1000d) and a fluid valve (120d) being in sequence connected in series through the pipeline (1004) then being connected in parallel and controlled by an electric control unit (ECU100) according to the present invention.

As shown in FIG. 14, the adjacently-installed temperature equalizers (1000a), (1000b), (1000c), (1000d) are respectively installed with the temperature sensor (TS120a), (TS120b), (TS120c), (TS120d); wherein the adjacently-installed temperature equalizer (1000a) and the adjacently-installed temperature equalizer (1000b) and the fluid valve (120b) are in sequence connected in series through the pipeline (1004), the adjacently-installed temperature equalizer (1000c) and the adjacently-installed temperature equalizer (1000d) and the fluid valve (120d) are in sequence connected in series through the pipeline (1004) then the temperature equalizers respectively on two pipelines are connected in parallel and controlled by the electric control unit (ECU100), thereby structuring the temperature control system; wherein the electric control unit (ECU100) receives the signal of the input control device (IP100) and the signal sensed by the temperature sensor (TS120a), (TS120b), (TS120c), (TS120d) for respectively controlling the fluid valve (120b), (120d) to be ON/OFF or controlling the fluid amount, so as to respectively control the fluid amount passing the adjacently-installed temperature equalizers (1000a), (1000b), (1000c), (1000d) thereby altering the thermal energy transferred by the individual adjacently-installed temperature equalizer to the location where the object (103) is disposed; wherein The electric control unit (ECU100): constituted by one or more than one of followings, including: 1) electromechanical circuit device; 2) solid state electronic circuit device; 3) devices consisted of microprocessor, or single chip control unit, software, operation program and peripheral circuit devices;

Input control device (IP100): constituted by the human-machine interface device and subjected to receive manual input or receive inputted signals or operative commands;

The power supply device (PS100) is served to provide electric energy for the system operation.

Figure 15:
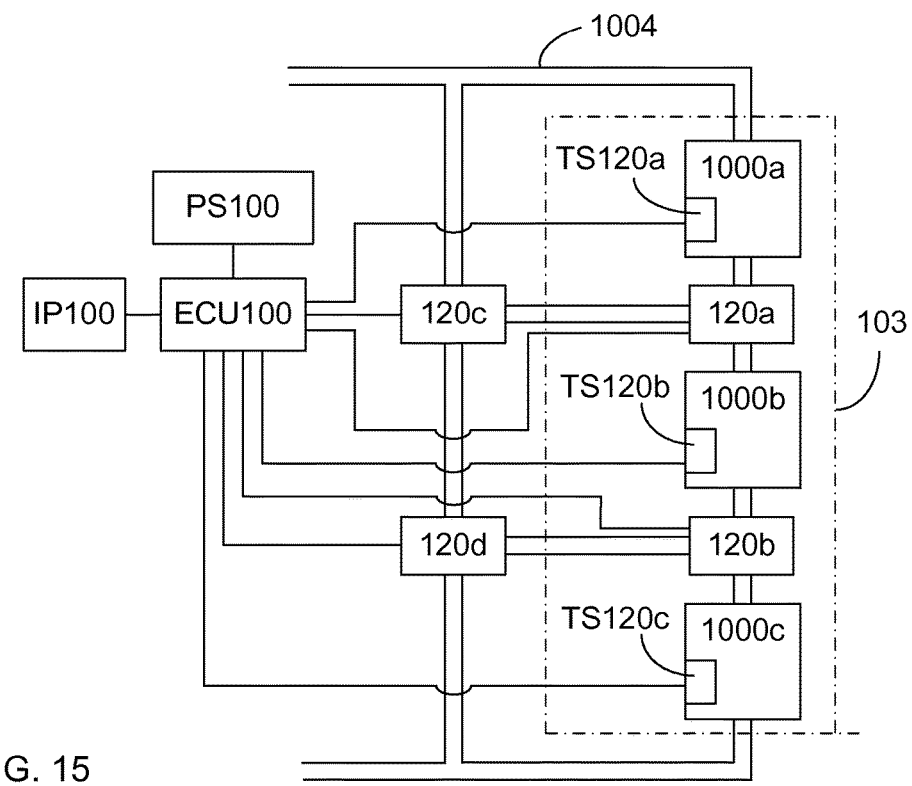
FIG. 15 is a schematic view illustrating a temperature control system being structured by plural adjacently-installed temperature equalizers (1000*a*), (1000*b*), (1000*c*) being respectively installed with a temperature sensor (TS120*a*), (TS120*b*), (TS120*c*), wherein the adjacently-installed temperature equalizer (1000*a*), a fluid valve (120*a*), the adjacently-installed temperature equalizer (1000*b*), a fluid valve (120*b*) and the adjacently-installed temperature equalizer (1000*c*) being in sequence connected in series through a pipeline (1004), and fluid valves (120*c*), (120*d*) being connected in series then connected in parallel between the fluid inlet and outlet end, the fluid valve (120*c*) and the fluid valve (120*a*) being controlled by an electric control unit (ECU100) for being communicated for operation, the fluid valve (120*d*) and the fluid valve (120*b*) being controlled by the electric control unit (ECU100) for being communicated for operation thereby providing the bypass control and controlled by the electric control unit (ECU100) according to the present invention.

FIG. 15 is a schematic view illustrating a temperature control system being structured by plural adjacently-installed temperature equalizers (1000a), (1000b), (1000c) being respectively installed with a temperature sensor (TS120a), (TS120b), (TS120c), wherein the adjacently-installed temperature equalizer (1000a), a fluid valve (120a), the adjacently-installed temperature equalizer (1000b), a fluid valve (120b) and the adjacently-installed temperature equalizer (1000c) being in sequence connected in series through a pipeline (1004), and fluid valves (120c), (120d) being connected in series then connected in parallel between the fluid inlet and outlet end, the fluid valve (120c) and the fluid valve (120a) being controlled by an electric control unit (ECU100) for being communicated for operation, the fluid valve (120d) and the fluid valve (120b) being controlled by the electric control unit (ECU100) for being communicated for operation thereby providing the bypass control and controlled by the electric control unit (ECU100) according to the present invention.

As shown in FIG. 15, the plural adjacently-installed temperature equalizers (1000a), (1000b), (1000c) are respectively installed with a temperature sensor (TS120a), (TS120b), (TS120c), wherein the adjacently-installed temperature equalizer (1000a), the fluid valve (120a), the adjacently-installed temperature equalizer (1000b), the fluid valve (120b) and the adjacently-installed temperature equalizer (1000c) are in sequence connected in series through the pipeline (1004), and the fluid valves (120c), (120d) are connected in series then connected in parallel between the fluid inlet and outlet end, the fluid valve (120c) and the fluid valve (120a) are controlled by the electric control unit (ECU100) for being communicated for operation, the fluid valve (120d) and the fluid valve (120b) are controlled by the electric control unit (ECU100) for being communicated for operation thereby the temperature control system providing the bypass control and controlled by the electric control unit (ECU100) is structured; wherein the electric control unit (ECU100) receives the signal of the input control device (IP100) and the signals sensed by the temperature sensors (TS120a), (TS120b), (TS120c), (TS120d) for respectively controlling the fluid valves (120a), (120b), (120c), (120d) to be ON/OFF or controlling the passing fluid amount, so as to respectively control the fluid amount passing the adjacently-installed temperature equalizers (1000a), (1000b), (1000c), (1000d) thereby altering the thermal energy transferred by the individual adjacently-installed temperature equalizer to the location where the object (103) is disposed; wherein The electric control unit (ECU100): constituted by one or more than one of followings, including: 1) electromechanical circuit device; 2) solid state electronic circuit device; 3) devices consisted of microprocessor, or single chip control unit, software, operation program and peripheral circuit devices;

Input control device (IP100): constituted by the human-machine interface device and subjected to receive manual input or receive inputted signals or operative commands;

The power supply device (PS100) is served to provide electric energy for the system operation.

FIG. 16 is a schematic view illustrating a temperature control system being structured by plural adjacently-installed temperature equalizers (1000a), (1000b), (1000c), (1000d) being respectively installed with a temperature sensor (TS120a), (TS120b), (TS120c), (TS120d), the adjacently-installed temperature equalizer (1000a), a fluid valve (120a) and the adjacently-installed temperature equalizer (1000b) being in sequence connected in series through a pipeline (1004), the adjacently-installed temperature equalizer (1000c), a fluid valve (120c) and the adjacently-installed temperature equalizer (1000d) being in sequence connected in series through the pipeline (1004), then being connected in parallel, a communicating pipeline being installed between the fluid valve (120a) and the fluid valve (120c), the fluid valves (120a), (120b) being served to provide the bypass control and controlled by an electric control unit (ECU100) according to the present invention.

As shown in FIG. 16, the plural adjacently-installed temperature equalizers (1000a), (1000b), (1000c), (1000d) are respectively installed with a temperature sensor (TS120a), (TS120b), (TS120c), (TS120d), the adjacently-installed temperature equalizer (1000a), the fluid valve (120a) and the adjacently-installed temperature equalizer (1000b) are in sequence connected in series through the pipeline (1004), the adjacently-installed temperature equalizer (1000c), the fluid valve (120c) and the adjacently-installed temperature equalizer (1000d) are in sequence connected in series through the pipeline (1004), then being connected in parallel, the communicating pipeline is installed between the fluid valve (120a) and the fluid valve (120c), so that the fluid valves (120a), (120b) is served to provide the bypass control and controlled by the electric control unit (ECU100), thereby structuring the temperature control system; wherein the electric control unit (ECU100) receives the signal of the input control device (IP100) and the signals sensed by the temperature sensors (TS120a), (TS120b), (TS120c), (TS120d) for respectively controlling the fluid valves (120a), (120b) to be ON/OFF or controlling the passing fluid amount, so as to respectively control the fluid amount passing the adjacently-installed temperature equalizers (1000a), (1000b), (1000c), (1000d) thereby altering the thermal energy transferred by the individual adjacently-installed temperature equalizer to the location where the object (103) is disposed;

The electric control unit (ECU100): constituted by one or more than one of followings, including: 1) electromechanical circuit device; 2) solid state electronic circuit device; 3) devices consisted of microprocessor, or single chip control unit, software, operation program and peripheral circuit devices;

Input control device (IP100): constituted by the human-machine interface device and subjected to receive manual input or receive inputted signals or operative commands;

The power supply device (PS100) is served to provide electric energy for the system operation.

FIG. 17 to FIG. 22 illustrate the temperature control system having adjacently-installed temperature equalizer and heat transfer fluid and application device thereof being applied for structuring a temperature control system in which one or more than one adjacently-installed temperature equalizer installed on the heat transferring surface of the object (103) being installed with a temperature actuated fluid valve;

FIG. 17 is a schematic view illustrating a temperature control system being structured by single adjacently-installed temperature equalizer (1000) being connected in series with a temperature actuated fluid valve (TV120) through a pipeline (1004) and controlled by the temperature actuated fluid valve (TV120) according to the present invention.

As shown in FIG. 17, the temperature actuated fluid valve (TV120) is a fluid valve enabled to be ON/OFF or alter the passing fluid amount along with the sensed temperature, installed on the adjacently-installed temperature equalizer (1000) and/or the object (103), the function of the individual temperature actuated fluid valve is to control the fluid amount passing the corresponding adjacently-installed temperature equalizer (1000) along with the sensed temperature, thereby regulating the thermal energy transferred by the adjacently-installed temperature equalizer (1000) to the location where the object (103) is disposed.

FIG. 18 is a schematic view illustrating a temperature control system being structured by plural adjacently-installed temperature equalizers (1000a), (1000b) being connected in series through a pipeline (1004) then being connected in series with a temperature actuated fluid valve (TV120) and controlled by the temperature actuated fluid valve (TV120) according to the present invention.

As shown in FIG. 18, the temperature actuated fluid valve (TV120) is a fluid valve enabled to be ON/OFF or alter the passing fluid amount along with the sensed temperature, installed on the adjacently-installed temperature equalizers (1000a), (1000b) and/or the object (103), the function of the individual temperature actuated fluid valve is to control the fluid amount passing the corresponding adjacently-installed temperature equalizer (1000a), (1000b) along with the sensed temperature, thereby regulating the thermal energy transferred by the individual adjacently-installed temperature equalizer (1000a), (1000b) to the location where the object (103) is disposed.

Figure 19:
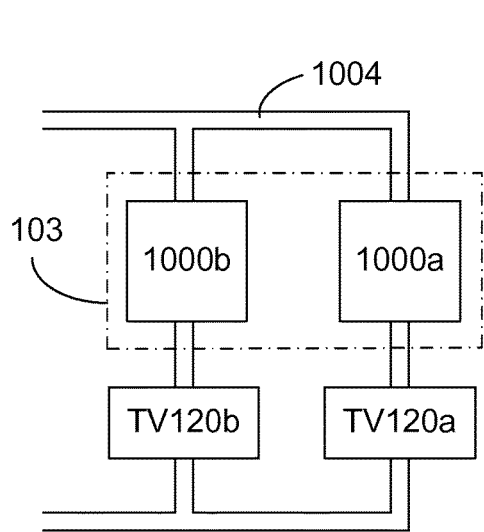
FIG. 19 is a schematic view illustrating a temperature control system being structured by plural adjacently-installed temperature equalizers (1000*a*), (1000*b*) being respectively connected in series with a temperature actuated fluid valve (TV120*a*), (TV120*b*) through a pipeline (1004) then being connected in parallel and controlled by the temperature actuated fluid valve (TV120*a*), (TV120*b*) according to the present invention.

FIG. 19 is a schematic view illustrating a temperature control system being structured by plural adjacently-installed temperature equalizers (1000a), (1000b) being respectively connected in series with a temperature actuated fluid valve (TV120a), (TV120b) through a pipeline (1004) then being connected in parallel and controlled by the temperature actuated fluid valve (TV120a), (TV120b) according to the present invention.

As shown in FIG. 19, the temperature actuated fluid valve (TV120a) is connected in series with the adjacently-installed temperature equalizer (1000a), the temperature actuated fluid valve (TV120b) is connected in series with the adjacently-installed temperature equalizer (1000b) then the two are connected in parallel, the temperature actuated fluid valve (TV120a) and the temperature actuated fluid valve (TV120b) are fluid valves enabled to be ON/OFF or alter the passing fluid amount along with the sensed temperature, installed on the adjacently-installed temperature equalizer (1000a) and the adjacently-installed temperature equalizer (1000b) and/or the object (103), the function of the individual temperature actuated fluid valve is to control the fluid amount passing the corresponding adjacently-installed temperature equalizers (1000a), (1000b) along with the sensed temperature, thereby regulating the thermal energy transferred by the individual adjacently-installed temperature equalizer (1000a), (1000b) to the location where the object (103) is disposed.

Figure 20:
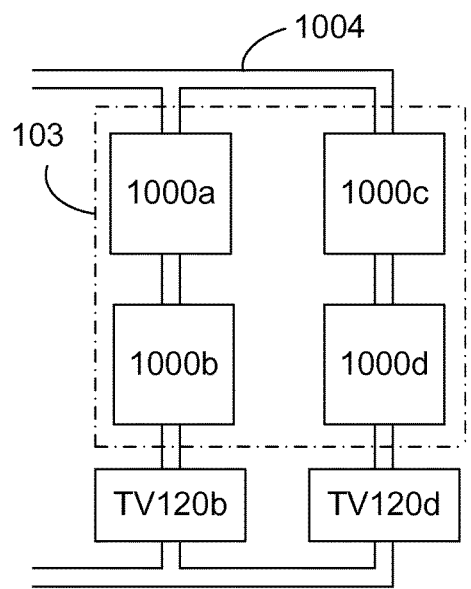
FIG. 20 is a schematic view illustrating a temperature control system being structured by plural adjacently-installed temperature equalizers (1000*a*), (1000*b*), (1000*c*), (1000*d*) being connected in series through a pipeline (1004) then being connected in series with a temperature actuated fluid valve (TV120*b*), (TV120*d*) and controlled by the temperature actuated fluid valve (TV120*b*), (TV120*d*), and being connected in parallel according to the present invention.

FIG. 20 is a schematic view illustrating a temperature control system being structured by plural adjacently-installed temperature equalizers (1000a), (1000b), (1000c), (1000d) being connected in series through a pipeline (1004) then being connected in series with a temperature actuated fluid valve (TV120b), (TV120d) and controlled by the temperature actuated fluid valve (TV120b), (TV120d), and being connected in parallel according to the present invention.

As shown in FIG. 20, the temperature actuated fluid valve (TV120b) and the adjacently-installed temperature equalizers (1000a), (1000b) are connected in series, the temperature actuated fluid valve (TV120d) and the adjacently-installed temperature equalizers (1000c), (1000d) are connected in series, then two lines are connected in parallel, the temperature actuated fluid valve (TV120b) and the temperature actuated fluid valve (TV120d) are fluid valves enabled to be ON/OFF or alter the passing fluid amount along with the sensed temperature, respectively installed on the adjacently-installed temperature equalizer (1000b) and the adjacently-installed temperature equalizer (1000d) and/or the object (103), the function of the individual temperature actuated fluid valve is to control the fluid amount passing the adjacently-installed temperature equalizers (1000a), (1000b) connected in series and the adjacently-installed temperature equalizers (1000c), (1000d) connected in series along with the sensed temperature, thereby regulating the thermal energy transferred by the individual adjacently-installed temperature equalizer (1000a), (1000b), (1000c), (1000d) to the location where the object (103) is disposed.

Figure 21:
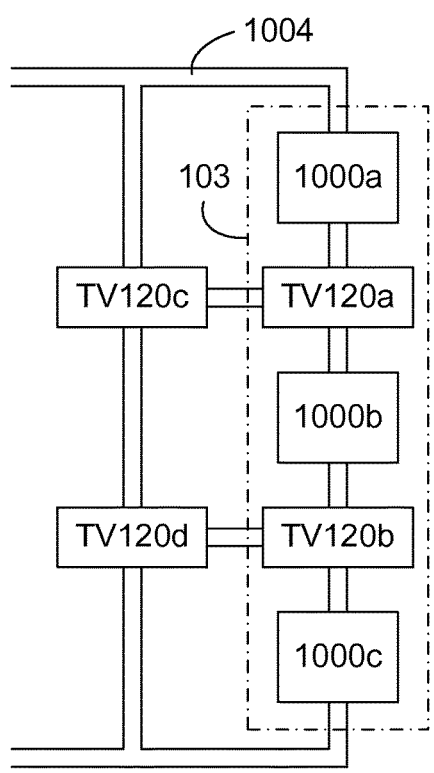
FIG. 21 is a schematic view illustrating a temperature control system being structured by an adjacently-installed temperature equalizer (1000*a*), a temperature actuated fluid valve (TV120*a*), an adjacently-installed temperature equalizer (1000*b*), a temperature actuated fluid valve (TV120*b*) and an adjacently-installed temperature equalizer (1000*c*) being in sequence connected in series through a pipeline (1004), temperature actuated fluid valves (TV120*c*), (TV120*d*) being connected in series then connected in parallel between the fluid inlet end and the fluid outlet end of the pipeline (1004), a communicating pipeline being installed between the temperature actuated fluid valve (TV120*a*) and the temperature actuated fluid valve (TV120*c*), a communicating pipeline being installed between the temperature actuated fluid valve (TV120*b*) and the temperature actuated fluid valve (TV120d) so as to provide the bypass control according to the present invention.

FIG. 21 is a schematic view illustrating a temperature control system being structured by an adjacently-installed temperature equalizer (1000a), a temperature actuated fluid valve (TV120a), an adjacently-installed temperature equalizer (1000b), a temperature actuated fluid valve (TV120b) and an adjacently-installed temperature equalizer (1000c) being in sequence connected in series through a pipeline (1004), temperature actuated fluid valves (TV120c), (TV120d) being connected in series then connected in parallel between the fluid inlet end and the fluid outlet end of the pipeline (1004), a communicating pipeline being installed between the temperature actuated fluid valve (TV120a) and the temperature actuated fluid valve (TV120c), a communicating pipeline being installed between the temperature actuated fluid valve (TV120b) and the temperature actuated fluid valve (TV120d) so as to provide the bypass control according to the present invention.

As shown in FIG. 21, the adjacently-installed temperature equalizer (1000a), the temperature actuated fluid valve (TV120a), the adjacently-installed temperature equalizer (1000b), the temperature actuated fluid valve (TV120b) and the adjacently-installed temperature equalizer (1000c) are in sequence connected in series through the pipeline (1004), the temperature actuated fluid valves (TV120c), (TV120d) are firstly connected in series then connected in parallel between the fluid inlet end and the fluid outlet end of the pipeline (1004), a communicating pipeline is installed between the temperature actuated fluid valve (TV120a) and the temperature actuated fluid valve (TV120c), and a communicating pipeline is installed between the temperature actuated fluid valve (TV120b) and the temperature actuated fluid valve (TV120d) so as to structure a temperature control system providing bypass control; wherein the temperature actuated fluid valves (TV120a), (TV120b), (TV120c), (TV120d) are fluid valves enabled to be ON/OFF or alter the passing fluid amount along with the sensed temperature, respectively installed on the adjacently-installed temperature equalizers (1000*a*), (1000*b*), (1000*c*) and/or the object (103), the function of the individual temperature actuated fluid valve is to control the fluid amount passing the adjacently-installed temperature equalizers (1000*a*), (1000*b*), (1000*c*) connected in parallel along with the sensed temperature, thereby regulating the thermal energy transferred by the individual adjacently-installed temperature equalizer (1000*a*), (1000*b*), (1000*c*) to the location where the object (103) is disposed.

Figure 22:
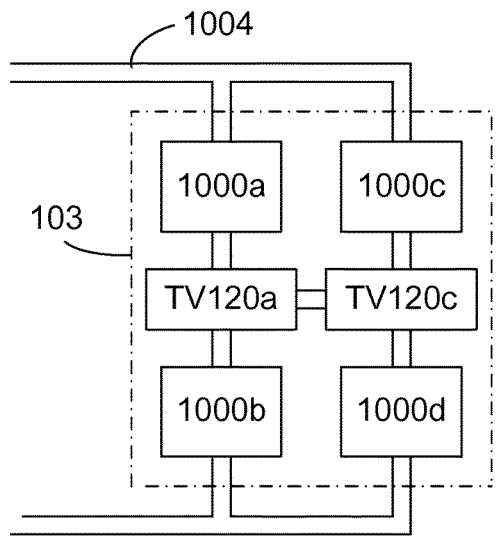
FIG. 22 is a schematic view illustrating a temperature control system being structured by an adjacently-installed temperature equalizer (1000a), a temperature actuated fluid valve (TV120a) and an adjacently-installed temperature equalizer (1000b) being in sequence connected in series through a pipeline (1004), an adjacently-installed temperature equalizer (1000c), a temperature actuated fluid valve (TV120c) and an adjacently-installed temperature equalizer (1000d) being in sequence connected in series through the pipeline (1004), then being connected in parallel and leaded to the fluid inlet end and the fluid outlet end of the pipeline (1004), the temperature actuated fluid valve (TV120a) and the temperature actuated fluid valve (TV120c) being served to provide the bypass control according to the present invention.

FIG. 22 is a schematic view illustrating a temperature control system being structured by an adjacently-installed temperature equalizer (1000*a*), a temperature actuated fluid valve (TV120*a*) and an adjacently-installed temperature equalizer (1000*b*) being in sequence connected in series through a pipeline (1004), an adjacently-installed temperature equalizer (1000*c*), a temperature actuated fluid valve (TV120*c*) and an adjacently-installed temperature equalizer (1000*d*) being in sequence connected in series through the pipeline (1004), then being connected in parallel and leaded to the fluid inlet end and the fluid outlet end of the pipeline (1004), the temperature actuated fluid valve (TV120*a*) and the temperature actuated fluid valve (TV120*c*) being served to provide the bypass control according to the present invention.

As shown in FIG. 22, the adjacently-installed temperature equalizer (1000*a*), the temperature actuated fluid valve (TV120*a*) and the adjacently-installed temperature equalizer (1000*b*) are in sequence connected in series through the pipeline (1004), the adjacently-installed temperature equalizer (1000*c*), the temperature actuated fluid valve (TV120*c*) and the adjacently-installed temperature equalizer (1000*d*) are in sequence connected in series through the pipeline (1004), then the two lines being connected in parallel and leaded to the fluid inlet end and the fluid outlet end of the pipeline (1004), the temperature actuated fluid valve (TV120*a*) and the temperature actuated fluid valve (TV120*c*) are served to provide the bypass control, thereby structuring a temperature control system; wherein the temperature actuated fluid valves (TV120*a*), (TV120*c*) are fluid valves enabled to be ON/OFF or alter the passing fluid amount along with the sensed temperature, respectively installed on the adjacently-installed temperature equalizers (1000*a*), (1000*b*), (1000*c*) and/or the object (103), the function is to control the fluid amount passing the individual adjacently-installed temperature equalizers (1000*a*), (1000*b*), (1000*c*), (1000*d*) along with the sensed temperature, thereby regulating the thermal energy transferred by the individual adjacently-installed temperature equalizer (1000*a*), (1000*b*), (1000*c*), (1000*d*) to the location where the object (103) is disposed.

According to the present invention, the temperature control system having adjacently-installed temperature equalizer and heat transfer fluid and application device thereof is able to be widely applied in various fields, for example: a rechargeable battery or a liquid crystal display, a semiconductor substrate, a heat dissipater, an air conditioning heat exchanger, or a machine housing of a precision machine or a multi dimension measurement device, or a selected location at the exterior and/or the interior of the machine body, through pumping the external heat transfer fluid for cooling or heating, the adjacently-installed object (103) is enabled to be processed with the heat transfer for being cooled or heated, thereby preventing the working temperature of the semiconductor unit, the photovoltaic, the LED or the rechargeable battery or the liquid crystal display from being overly high or overly low and avoiding the performance deterioration; and/or when being applied in an electric motor, a power generator or a transformer with its loading getting greater or the environmental temperature getting higher, the overheating and performance deterioration and the burning damage can be prevented, when being applied in the precision machine or the multi dimension measurement device, the geometric shape of the machine housing can be ensured to be stable and the precision can also be ensured; when the adjacently-installed temperature equalizer with its opened surface being provided with heat insulating property is adopted, the object (103) can be disposed on a surface of the adjacently-installed temperature equalizer with its opened surface being provided with heat insulating property, thereby (a) heat transferring property being provided; or (b) a heat insulation layer or a heat insulation structure being provided for preventing or reducing the heat transfer of radiating, transferring and convecting.

Figure 23:
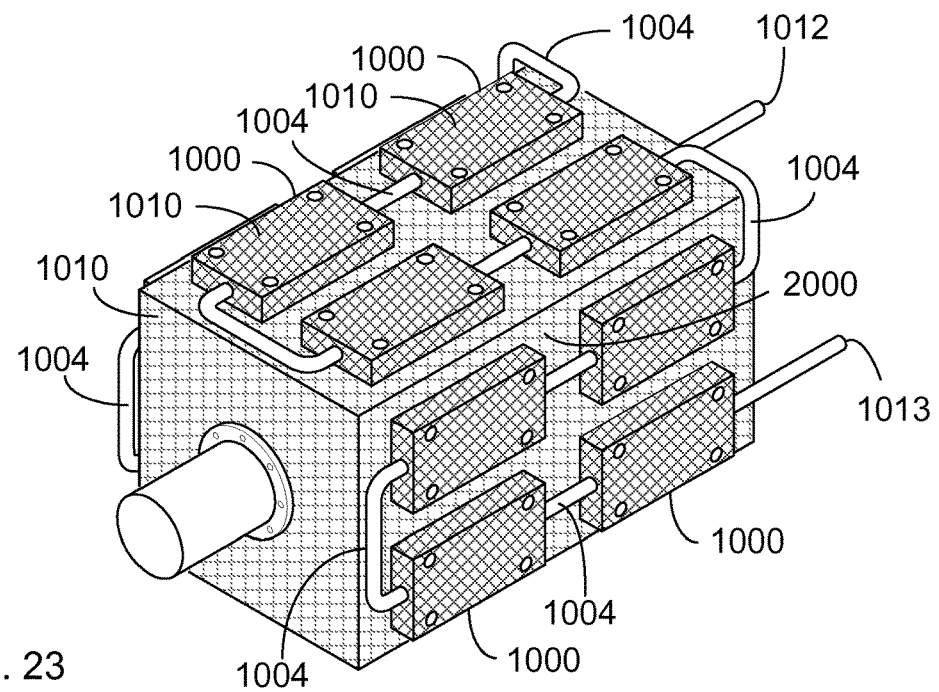
FIG. 23 is a schematic view illustrating an application in which the adjacently-installed temperature equalizer with its opened surface being provided with heat insulating property being installed on a surface of a revolving electric machine (2000) according to the present invention.

FIG. 23 is a schematic view illustrating an application in which the adjacently-installed temperature equalizer with its opened surface being provided with heat insulating property being installed on a surface of a revolving electric machine (2000) according to the present invention.

As shown in FIG. 23, a part of the outer surface defined on the housing of the revolving electric machine (2000) is provided with great heat conductive property and covered by the adjacently-installed temperature equalizer, the residual outer surface can be totally or partially provided with a heat insulation layer (1010).

Figure 24:
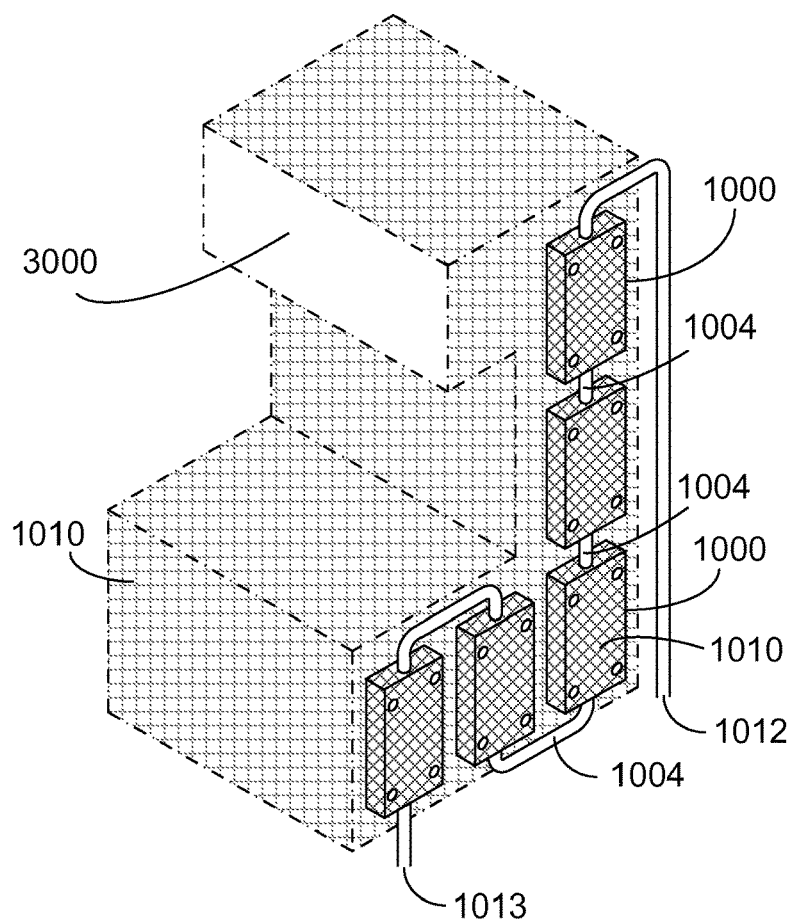
FIG. 24 is a schematic view illustrating an application in which the adjacently-installed temperature equalizer with its opened surface being provided with heat insulating property being installed on a surface of a tool machine body (3000) according to the present invention.

FIG. 24 is a schematic view illustrating an application in which the adjacently-installed temperature equalizer with its opened surface being provided with heat insulating property being installed on a surface of a tool machine body (3000) according to the present invention.

As shown in FIG. 24, a part of the outer surface defined on the housing of the tool machine body (3000) is provided with great heat conductive property and covered by the adjacently-installed temperature equalizer, the residual outer surface can be totally or partially provided with a heat insulation layer (1010).

Figure 25:
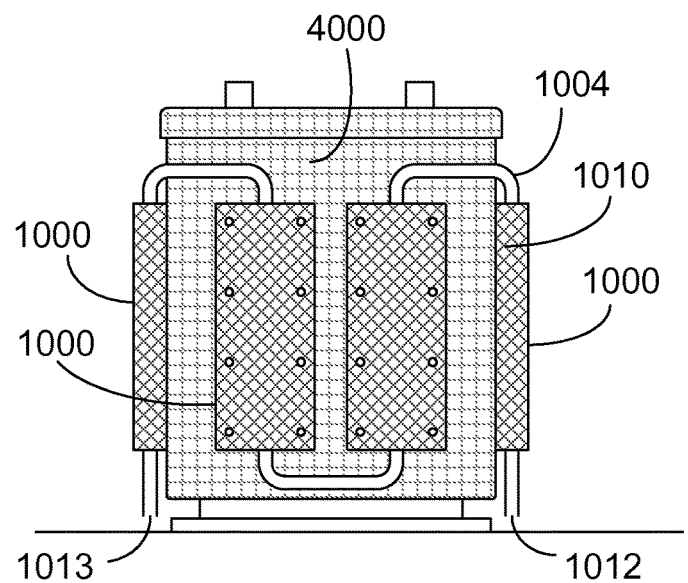
FIG. 25 is a schematic view illustrating an application in which the adjacently-installed temperature equalizer with its opened surface being provided with heat insulating property being installed on a surface of a transformer (4000) according to the present invention.

FIG. 25 is a schematic view illustrating an application in which the adjacently-installed temperature equalizer with its opened surface being provided with heat insulating property being installed on a surface of a transformer (4000) according to the present invention.

As shown in FIG. 25, a part of the outer surface defined on the housing of the transformer (4000) is provided with great heat conductive property and covered by the adjacently-installed temperature equalizer, the residual outer surface can be totally or partially provided with a heat insulation layer (1010).

Figure 26:
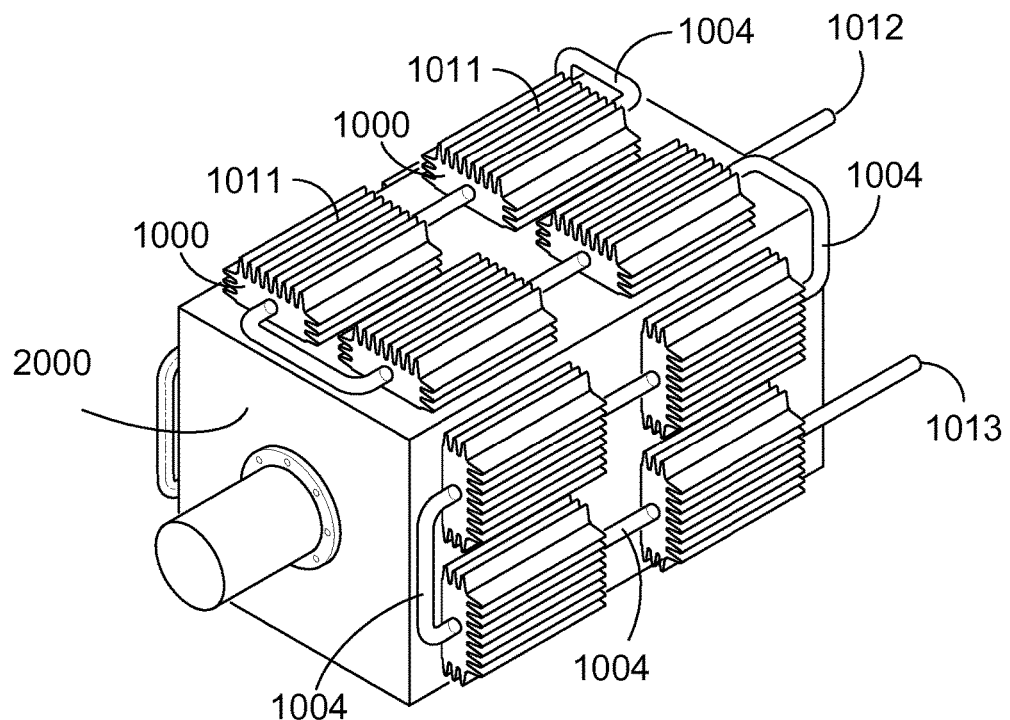
FIG. 26 is a schematic view illustrating an application in which the adjacently-installed temperature equalizer with its opened surface being provided with heat transferring property being installed on a surface of a revolving electric machine (2000) according to the present invention.

FIG. 26 is a schematic view illustrating an application in which the adjacently-installed temperature equalizer with its opened surface being provided with heat transferring property being installed on a surface of a revolving electric machine (2000) according to the present invention.

As shown in FIG. 26, a part of the outer surface defined on the housing of the revolving electric machine (2000) is provided with great heat conductive property and covered by the adjacently-installed temperature equalizer, the residual outer surface can be totally or partially formed with a structure having function of transferring, radiating or convecting heat to the exterior.

Figure 27:
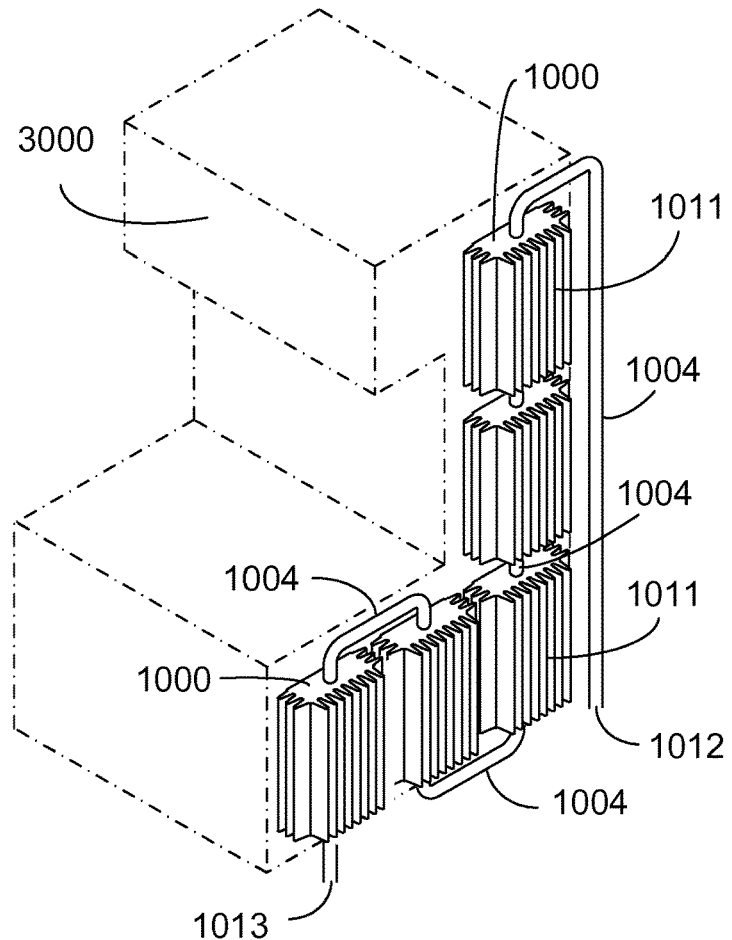
FIG. 27 is a schematic view illustrating an application in which the adjacently-installed temperature equalizer with its opened surface being provided with heat transferring property being installed on a surface of a tool machine body (3000) according to the present invention.

FIG. 27 is a schematic view illustrating an application in which the adjacently-installed temperature equalizer with its opened surface being provided with heat transferring property being installed on a surface of a tool machine body (3000) according to the present invention.

As shown in FIG. 27, a part of the outer surface defined on the housing of the tool machine body (3000) is provided with great heat conductive property and covered by the adjacently-installed temperature equalizer, the residual outer surface can be totally or partially formed with a structure having function of transferring, radiating or convecting heat to the exterior.

Figure 28:
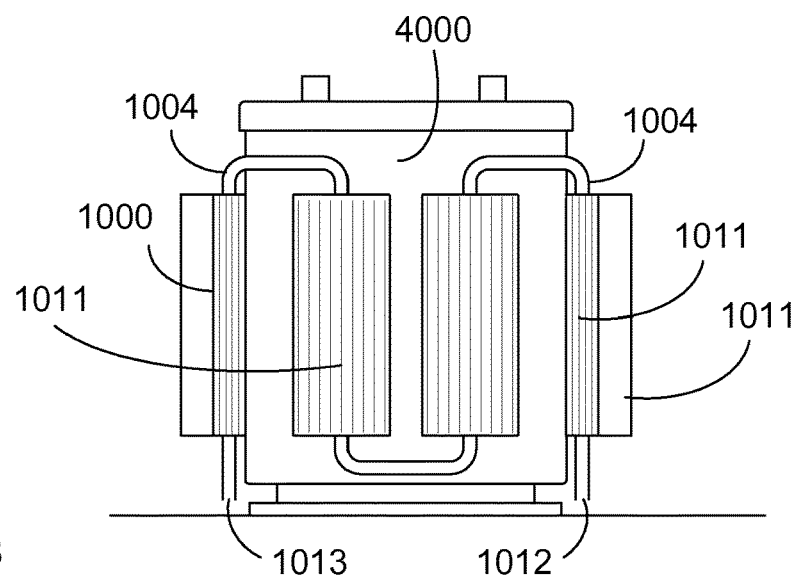
FIG. 28 is a schematic view illustrating an application in which the adjacently-installed temperature equalizer with its opened surface being provided with heat transferring property being installed on a surface of a transformer (4000) according to the present invention.

FIG. 28 is a schematic view illustrating an application in which the adjacently-installed temperature equalizer with its opened surface being provided with heat transferring property being installed on a surface of a transformer (4000) according to the present invention.

As shown in FIG. 28, a part of the outer surface defined on the housing of the transformer (4000) is provided with great heat conductive property and covered by the adjacently-installed temperature equalizer, the residual outer surface can be totally or partially formed with a structure having function of transferring, radiating or convecting heat to the exterior.

The invention claimed is:

1. A temperature control system, comprising:
a plurality of temperature equalizers (1000) made up of equalizer members respectively formed with an adjacent heat transferring surface (1005) and a fluid channel (1001) for allowing an external heat transfer fluid to pass therethrough, the plurality of temperature equalizers (1000) being adapted to be installed on an object (103) such that the adjacent heat transferring surfaces (1005) are in thermal contact with an external surface (5000) and/or an internal surface (5001) of the object (103), a temperature of the object (103) being controlled by transfer of thermal energy between the object (103) and the temperature equalizers (1000) through the adjacent heat transferring surfaces (1005), and by transfer of thermal energy between the temperature equalizers (1000) and the external heat transfer fluid passing through the fluid channels (1001);
a single respective fluid pipe opening (1002, 1003) at opposite ends of each fluid channel (1001);
a plurality of fluid valves (TV120a, TV120b, TV120c, TV120d, 120a, 120b, 120c, 120d),
a pipeline (1004) having segments respectively connected to the fluid pipe openings (1002, 1003) of each of the temperature equalizers (1000) and to each of the plurality of fluid valve (TV120a, TV120b, TV120c, TV120d, 120a, 120b, 120c, 120d);
wherein the plurality of temperature equalizers (1000), the pipeline (1004), and the at least one fluid valve (TV120a, TV120b, TV120c, TV120d, 120a, 120b, 120c, 120d) are arranged in at least one of the following configurations:
a) one or more of said temperature equalizers (1000a, 1000b, 1000c, 1000d) is series connected with at least a first one of said fluid valves (TV120a, TV120b, 120a, 120b) to form at least one equalizer-valve series, and at least a second one of said fluid valves (TV120c, TV120d, 120c, 120d) is parallel connected with the at least one equalizer-valve series to provide bypass control for the at least one equalizer-valve series, and
b) at least a first two of the temperature equalizers (1000a, 1000b) are series connected to each other and to at least a first one of said fluid valves (TV120a, TV120b, 120a, 120b) to form a first equalizer-valve series, at least a second two of the temperature equalizers (1000c, 1000d) are series connected to each other and to at least a second one of said fluid valve (TV120c, TV120d, 120c, 120d) to form a second equalizer-valve series, and the first and second equalizer-valve series are parallel connected to provide mutual bypass control.

2. The temperature control system as claimed in claim 1, further comprising an electric control unit (ECU100) for operating individual ones of the fluid valves (120a, 120b, 120c, 120d) to regulate the amount of the external heat transfer fluid passing the temperature equalizers (1000a, 1000b, 1000c, 1000d), thereby regulating the transfer of thermal energy to or from the object (103).

3. The temperature control system as claimed in claim 2, wherein at least one of the temperature equalizers (1000) is installed with a respective temperature sensor (TS120a, TS120b, TS120c, TS120d), and the respective temperature sensor (TS120a, TS120b, TS120c, TS120d) and at least one fluid valve (120a, 120b, 120c, 120d) is connected to an electric control unit (ECU100) that controls the at least one fluid valve (120a, 120b, 120c, 120d) in response to temperatures detected by the respective temperature sensor (TS120a, TS120b, TS120c, TS120d).

4. The temperature control system as claimed in claim 2, further comprising an input control device (IP100) for inputting commands to the electric control unit (ECU100).

5. The temperature control system as claimed in claim 2, further comprising a power supply device (PS100) for providing electrical power to the electric control unit (ECU100).

6. The temperature control system as claimed in claim 1, wherein the fluid valves (TV120a, TV120b, TV120c, TV120d, 120a, 120b, 120c, 120d) are operated by manual force, mechanical force, electromagnetic force, air pressure force, and/or hydraulic force to provide ON/OFF control of the fluid valve or to control the amount of the external heat transfer fluid passing through the temperature equalizers (1000a, 1000b, 1000c, 1000d).

7. The temperature control system as claimed in claim 1, wherein surfaces of the temperature equalizers (1000) other than the heat transferring surfaces (1005) are thermally insulated by an insulation layer (1010).

8. The temperature control system as claimed in claim 1, wherein surfaces of the temperature equalizers (1000) other than the heat transferring surfaces (1005) have heat-dissipating fin structures (1011) extending therefrom.

9. The temperature control system as claimed in claim 1, wherein the plurality of temperature equalizers (1000), the pipeline (1004), and the at least one fluid valve (TV120a, TV120b, TV120c, TV120d, 120a, 120b, 120c, 120d) are arranged in said configuration (a).

10. The temperature control system as claimed in claim 9, wherein a number of temperature equalizers (1000a, 1000b, 1000c) in the at least one equalizer-valve series is at least three, a number of the at least a first one of the fluid valves (TV120a, TV120b, 120a, 120b) in the at least one equalizer-valve series is at least two, and a number of the at least a second one of the fluid valves (TV120c, TV120d, 120c, 120d) is at least two.

11. The temperature control system as claimed in claim 1, wherein the plurality of temperature equalizers (1000), the pipeline (1004), and the at least one fluid valve (TV120a, TV120b, TV120c, TV120d, 120a, 120b, 120c, 120d) are arranged in said configuration (b).

12. The temperature control system as claimed in claim 11, wherein a number of the temperature equalizers (1000a) and a number the fluid valves (TV120a, 120a) in the at least one first equalizer-valve series is one, and wherein a number of the temperature equalizers (1000*b*) and a number of the fluid valves (TV120*b*, 120*b*) in the at least one second equalizer-valve series is one.

13. The temperature control system as claimed in claim 11, wherein a number of the temperature equalizers (1000*a*, 1000*b*) in the at least one first equalizer-valve series is at least two, a number of the fluid valves (TV120*a*, TV120*c*, 120*a*, 120*c*) in the at least one first equalizer-valve series is at least one, a number of the temperature equalizers (1000*c*, 1000*d*) in the at least one second equalizer-valve series is at least two, and a number of the fluid valves (TV120*b*, TV120*d*, 120*b*, 120*d*) in the at least one second equalizer-valve series is at least one.

14. The temperature control system as claimed in claim 13, wherein the fluid valves (TV120*a*, TV120*c*, 120*a*, 120*c*) in respective said first and second equalizer-valve series are each connected between two of the temperature equalizers (1000*a*, 1000*b* and 1000*c*, 1000*d*) in the respective series, and further connected to each other, to enable selective bypass of at least one of the temperature equalizers (1000*a*, 1000*b* and 1000*c*, 1000*d*) in the respective series, whereby the at least one fluid valve (TV120*a*, TV120*c*, 120*a*, 120*c*) in each respective series are selectively controlled to cause the fluid to flow along any one of the following paths:

(a) in parallel through the temperature equalizers (1000*a*, 1000*b* and 1000*c*, 1000*d*) and the respective valves (TV120*a*, TV120*c*, 120*a*, 120*c*) in each series;

(b) through at least one temperature equalizer (1000*a*...) in the first series, through at least one connection between one of the fluid valves (TV120*a*, 120*a*...) in the first series and one of the fluid valves (TV120*c*, 120*c*...) in the second series, and through at least one second temperature equalizer (1000*d*...) in the second series;

(c) through at least one temperature equalizer (1000*c*...) in the second series, through at least one connection between one of the fluid valves (TV120*c*, 120*c*...) in the second series and one of the fluid valves (TV120*a*, 120*a*...) in the first series, and through at least one second temperature equalizer (1000*b*...) in the first series.

15. The temperature control system as claimed in claim 13, wherein the temperature equalizers (1000*a*, 1000*b* and 1000*c*, 1000*d*) in respective said first and second equalizer-valve series are directly connected to each other by the pipeline segments, and then series connected to respective said fluid valves (TV120*b*, TV120*d*, 120*b*, 120*d*).

16. The temperature control system as claimed in claim 1, wherein at least one of the fluid valves (TV120*a*, TV120*b*, TV120*c*, TV120*d*) is a temperature-actuated fluid valve.

* * * * *